United States Patent
Klein et al.

(10) Patent No.: US 8,603,318 B2
(45) Date of Patent: Dec. 10, 2013

(54) METHOD OF SELECTIVELY REMOVING CONDUCTIVE MATERIAL

(75) Inventors: Rita J. Klein, Boise, ID (US); Dale W. Collins, Boise, ID (US); Paul Morgan, Kuna, ID (US); Joseph N. Greeley, Boise, ID (US); Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 13/098,572

(22) Filed: May 2, 2011

(65) Prior Publication Data

US 2011/0203940 A1    Aug. 25, 2011

Related U.S. Application Data

(62) Division of application No. 11/507,291, filed on Aug. 21, 2006, now Pat. No. 7,935,242.

(51) Int. Cl.
*C25F 3/16* (2006.01)

(52) U.S. Cl.
USPC .......................... 205/675; 204/248; 205/657

(58) Field of Classification Search
USPC .................................. 204/248; 205/657, 675
See application file for complete search history.

(56) References Cited

U.S. PATENT DOCUMENTS

| | | | |
|---|---|---|---|
| 5,247,954 A | 9/1993 | Grant et al. | |
| 5,277,835 A * | 1/1994 | Ohmi et al. | 252/79.3 |
| 5,733,432 A | 3/1998 | Williams et al. | |
| 5,989,470 A | 11/1999 | Doan et al. | |
| 6,068,788 A * | 5/2000 | Kezuka et al. | 252/79.1 |
| 6,315,883 B1 | 11/2001 | Mayer et al. | |
| 6,316,364 B1 | 11/2001 | Kubo | |
| 6,709,565 B2 | 3/2004 | Mayer et al. | |
| 6,773,476 B2 | 8/2004 | Sakai et al. | |
| 6,811,680 B2 | 11/2004 | Chen et al. | |
| 6,858,091 B2 | 2/2005 | Boyd et al. | |
| 6,858,531 B1 | 2/2005 | Zhu et al. | |
| 6,899,804 B2 | 5/2005 | Duboust et al. | |
| 6,902,628 B2 | 6/2005 | Wang et al. | |
| 6,967,118 B2 | 11/2005 | Weng et al. | |
| 6,967,166 B2 | 11/2005 | Basol et al. | |
| 7,012,025 B2 | 3/2006 | Sun et al. | |
| 7,074,113 B1 | 7/2006 | Moore | |
| 7,112,122 B2 | 9/2006 | Lee et al. | |

(Continued)

OTHER PUBLICATIONS http://www.rafoeg.de/20,Dokumentenarchiv/20,Daten/dielectric_chart.pdf, Dec. 16, 2005.*

(Continued)

*Primary Examiner* — Nicholas A Smith
(74) *Attorney, Agent, or Firm* — TraskBritt

(57) ABSTRACT

An electrolyte solution, methods, and systems for selectively removing a conductive metal from a substrate are provided. The electrolyte solution comprising nanoparticles that are more noble than the conductive metal being removed, is applied to a substrate to remove the conductive metal selectively relative to a dielectric material without application of an external potential or contact of a processing pad with a surface of the substrate. The solutions and methods can be applied, for example, to remove a conductive metal layer (e.g., barrier metal) selectively relative to a dielectric material and to a materially different conductive metal (e.g., copper interconnect) without application of an external potential or contact of a processing pad with the surface of the substrate.

20 Claims, 7 Drawing Sheets

(56) References Cited

U.S. PATENT DOCUMENTS

| | | |
|---|---|---|
| 7,129,160 B2 | 10/2006 | Chopra |
| 7,153,777 B2 | 12/2006 | Lee |
| 7,167,353 B2 | 1/2007 | Yuyama et al. |
| 7,927,516 B2 * | 4/2011 | Strouse et al. ............. 252/519.1 |
| 2003/0181345 A1 | 9/2003 | Bian |
| 2005/0020192 A1 | 1/2005 | Lee et al. |
| 2005/0066585 A1 | 3/2005 | Bian et al. |
| 2005/0070211 A1 | 3/2005 | Bian |
| 2005/0097825 A1 | 5/2005 | Bian |
| 2005/0274617 A1 | 12/2005 | Bryning |
| 2005/0282390 A1 | 12/2005 | Bian et al. |
| 2006/0019132 A1 | 1/2006 | Lipilin et al. |
| 2006/0035564 A1 | 2/2006 | Novak et al. |
| 2006/0094189 A1 * | 5/2006 | Zurcher et al. ................ 438/257 |
| 2007/0238287 A1 * | 10/2007 | Greeley et al. ................ 438/629 |
| 2007/0251418 A1 | 11/2007 | Magee et al. |

OTHER PUBLICATIONS

Ionic liquid, from Wikipedia, the free encyclopedia, http://en.wikipedia.org/wiki/Ionic.sub.--liquid, Jan. 26, 2006.

Ionic liquid, http://www.organic-chemistry.org/topics/ionic-liquids.shtm, Jan. 26, 2006.

* cited by examiner

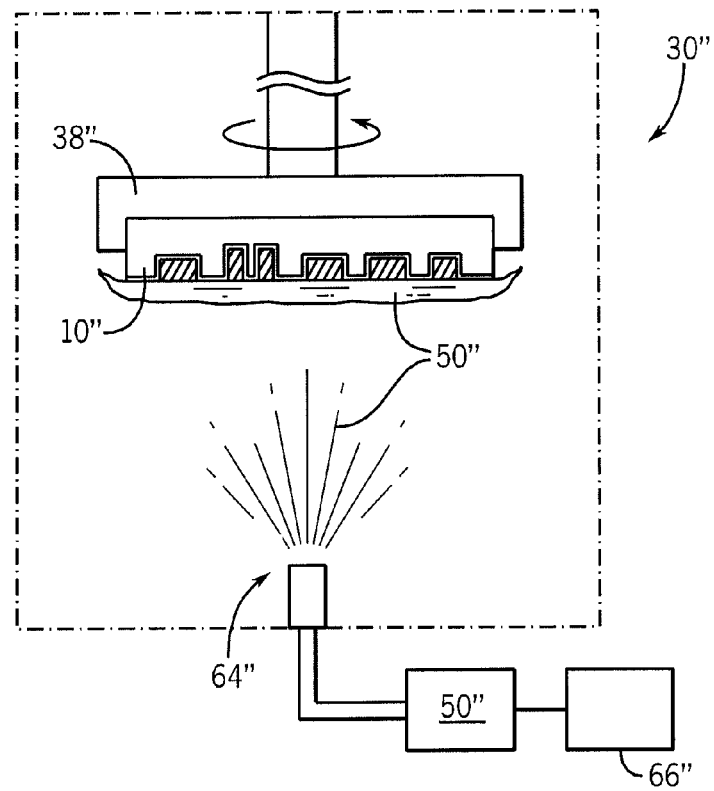
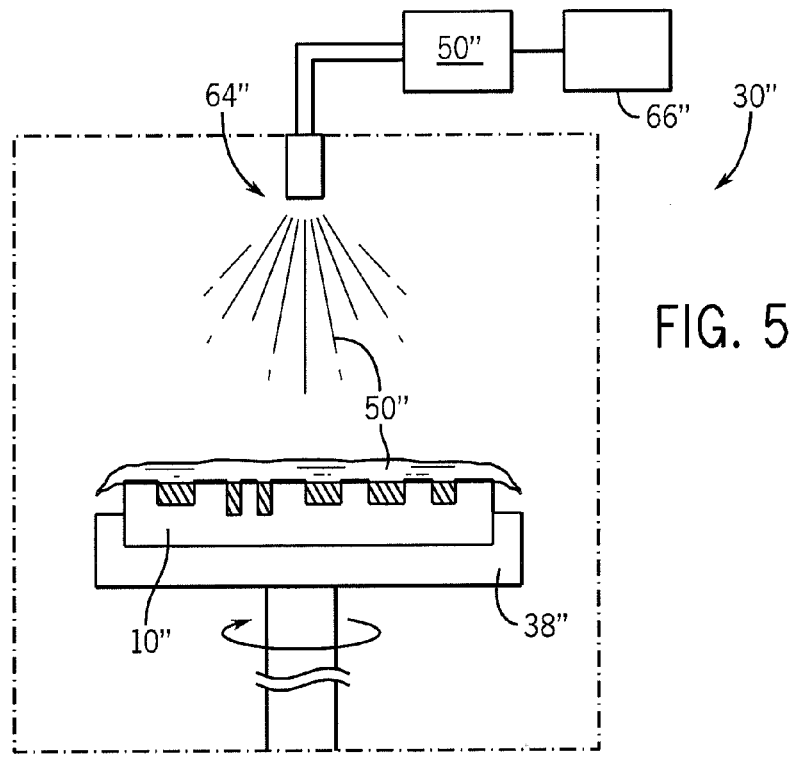

METHOD OF SELECTIVELY REMOVING CONDUCTIVE MATERIAL

CROSS-REFERENCE TO RELATED APPLICATION

This application is a divisional of U.S. patent application Ser. No. 11/507,291, filed Aug. 21, 2006, now U.S. Pat. No. 7,935,242, the entire contents of which is hereby incorporated by reference herein.

FIELD OF THE INVENTION

The invention relates generally to semiconductor processing for forming contacts and other features, and, more particularly, to methods and systems for selectively removing conductive metal(s) from a substrate.

BACKGROUND OF THE INVENTION

In the fabrication of semiconductor devices, contact holes and other features that are formed on a substrate are filled with a conductive material to provide contacts and other circuitry. One method for forming vertical and horizontal interconnects is by a damascene or dual damascene method. FIG. 1 illustrates a portion of a substrate 10 (e.g., wafer or microelectronic substrate) having conductive elements formed according to a prior art damascene method. The substrate 10 includes an insulating layer 12 (e.g., an interdielectric layer or ILD) deposited onto the substrate 10 and pattern etched to form interconnect openings 14. A barrier material layer 16, for example, tantalum (Ta), is deposited within the openings 14 to prevent diffusion of a conductive material such as copper into the insulating layer 12. Depending upon the material selected for the conductive layer, a separate seed layer 18, such as a copper seed layer, can then be deposited onto the barrier layer 16 prior to the formation of the metal layer, for example, by physical vapor deposition (PVD). The openings 14 can then be filled with a conductive metal 20 such as copper (Cu), resulting in excess material being deposited over the surface 22 of the substrate 10 outside or external to the openings 14.

In a typical process, excess deposited material 16, 20 external to the openings 14 is removed through planarizing or polishing the surface 22 of the substrate 10, for example, by a chemical-mechanical planarization (CMP) process, to isolate the conductive metal within the openings 14 and produce a substrate 10 having an embedded conductive interconnect or other structure, as depicted in FIG. 1A. During CMP processes, a carrier holds and rotates the substrate 10 in contact with a CMP pad and a polishing solution to mechanically remove material from the surface of the substrate 10. In an exemplary CMP process, excess copper material 20 is polished to the barrier layer 16 using a first slurry composition having a low abrasive content. The excess barrier layer 16 is then polished to the underlying insulating layer 12 using a second slurry composition.

Current low-k and future ultra low-k dielectrics are brittle and sensitive to the mechanical stresses needed to physically remove refractory metals, such as tantalum (Ta). Metal removal solutions that use ultra-low downforces are a current industry focus. Most barrier materials are difficult to remove by CMP because the barrier materials resist removal by abrasion and dissolution. Typical barrier removal slurries require a high abrasive concentration, which tend to result in "dishing" and scratching of the copper interconnect 20 within the openings 14 and detrimental erosion to the exposed insulating layer 12, including peeling and delaminating of low k dielectric layers from the wafer 10.

Another known approach for addressing those problems is to remove conductive materials using an electrochemical-mechanical polishing (ECMP) process or an electrolytic process. An exemplary ECMP process to remove the excess conductive material layer 20 and barrier layer 16 from substrate 10 is illustrated in FIG. 2. The substrate 10 (mounted on a substrate holder (not shown)) is brought into contact with an electrolytic liquid 24, which is dispensed onto a processing pad (situated on a platen). A current supply 28 is flowed through electrodes 26 to the electrolytic liquid 24 and the processing pad is brought into contact with the substrate, resulting in the removal of the conductive material layer 20 and barrier layer 16 to provide a clean surface 22, as in FIG. 1A. An advantage of electrolytic and ECMP processes is that the downforce applied to a substrate by a processing pad during a CMP processing can be reduced or eliminated.

However, current ECMP and electrolytic processes for material removal have several drawbacks, including difficulties associated with hardware and design requirements (voltage supply, electrodes, etc.). Another drawback of electrolytic processing occurs at the end of the process as the metal (e.g., Ta) is almost completely cleared from a substrate layer (e.g., dielectric layer) and the electrolytic process is disrupted by the termination of electrical contact (i.e., open circuit), resulting in residual islands of conductive metal remaining on the substrate.

Therefore, it would be desirable to provide a process that overcomes such problems.

SUMMARY OF THE INVENTION

The present compositions and methods facilitate removal of conductive metal(s) selectively relative to dielectric material in an electrolyte process without surface contact by a processing pad or the application of an external electric potential. The selective removal of the conductive metal is facilitated by contact of an electrolyte solution comprising nanoparticles more noble than the conductive metal, which are dispersed in a chemically compatible solvent.

The electrolyte solutions and processes are particularly useful in the removal of a first conductive metal (e.g., barrier metal layer) selectively relative to a second, different conductive metal (e.g., conductive metal interconnects) and dielectric material layers. The compositions and methods of the invention facilitate the formation of a galvanic couple and chemical reaction between the first conductive metal (e.g., barrier metal layer such as tantalum (Ta)) and nanoparticles within the electrolyte solution to preferentially and selectively dissolve or otherwise remove the first conductive metal in the presence of the second conductive metal (e.g., a metal interconnect material such as copper (Cu)).

In one aspect, the invention provides an electrolyte composition comprising nanoparticles for selective removal of conductive metal(s) less noble than the nanoparticles in the electrolyte solution selectively relative to dielectric material without the need for surface contact by a processing pad or the application of an external electric potential. In one embodiment, the composition comprises nanoparticles for selective removal of a first conductive metal relative to a second conductive metal from a substrate. The nanoparticles are composed of a substance that is more noble than the conductive metal to be removed and has a preferred particle size diameter of about 0.001 μm to 5 μm. Useful nanoparticles include colloidal carbon, silver, platinum, and gold, for example. In one embodiment, the electrolyte solution is composed of nanoparticles dispersed in an organic alcohol such as methanol, ethanol, and the like, with hydrofluoric acid. In another embodiment, the electrolyte solution is formulated with nanoparticles dispersed in an organic alcohol (e.g., methanol, ethanol, etc.) with a salt, for example, a salt of chloride, fluoride, succinate, and citrate, with ammonium and potassium salts being preferred, or an ionic liquid. In yet another embodiment, the electrolyte solution is composed of nanoparticles dispersed in a chemically compatible ionic liquid. The electrolyte solution is composed of a low dielectric solvent such as an alcohol, to make the solution selective to dielectric materials.

In another aspect, the invention provides methods for the selective removal of conductive metal(s) from a substrate selectively relative to dielectric material(s) by the application of the electrolyte solutions of the invention, without the need for surface contact by a processing pad or the application of an external electric potential. In one embodiment, the method can be applied for the removal of conductive metal(s) less noble than the nanoparticles in the electrolyte solution selectively relative to dielectric material. In another embodiment, the method can be applied to remove a first conductive metal in the presence of a second conductive metal selectively relative to dielectric material and to the second conductive metal. The method is particularly useful in selectively removing a barrier metal such as tantalum, tantalum nitride, titanium, and the like, in the presence of a conductive metal such as a copper interconnect, which has properties different than the barrier metal. The method involves contacting a substrate with an electrolyte solution of the invention for a time effective to remove conductive metal(s) selectively relative to dielectric material and/or remove a first conductive metal selectively relative to a second conductive metal and dielectric material, the two metals having different properties, without application of an external potential.

Preferably, the method provides for continuous movement of the electrolyte solution over the conductive metal to be removed. Such movement can be provided, for example, by moving the substrate within the solution, by moving a processing pad situated proximal to the substrate with the electrolyte solution therebetween, by moving a carrier supporting the substrate relative to the processing pad, by flowing the electrolyte solution through openings in a processing pad situated proximal to the substrate, and/or by actuating a high intensity wave-generator to vibrate the substrate, processing pad, and/or the electrolyte solution, among other mechanisms.

It is also desirable to provide pressure (i.e., a downforce or upforce) onto the electrolyte solution to enhance physical contact of the nanoparticles within the solution with the conductive metal to be removed. Such pressure can be provided, for example, by means of high-pressure spray, by pressing (forcing) the substrate carrier onto the electrolyte solution situated between the carrier and a processing pad, and the like.

In one embodiment of a method according to the invention, a substrate is positioned proximal to but not in contact with a processing pad, and an electrolyte solution of the invention is applied over the conductive metal(s) to be removed, between the substrate and the processing pad, without application of an external potential while creating relative movement between the substrate and the processing pad to cause the electrolyte solution to flow to selectively remove the conductive metal(s) from the substrate.

In another embodiment, the method involves spraying an electrolyte solution of the invention onto the surface of a substrate to selectively remove the conductive metal(s) from the surface of the substrate.

In a further embodiment of a method of the invention, the substrate is immersed into an electrolyte solution of the invention for a time effective to selectively remove the conductive metal(s) from the substrate without application of an external potential, preferably while continually moving the solution over the surface of the substrate.

In a further aspect of the invention, a system is provided for the removal of conductive metal(s) selectively relative to dielectric material and/or the removal of a first conductive metal selectively relative to dielectric material and a second conductive metal that is different from the first conductive metal, without the application of an external potential. In one embodiment, the system includes a support or carrier for a substrate (e.g., wafer, microelectronic substrate, etc.), a source of the electrolyte solution of the invention, which is connected to a dispenser for delivering the electrolyte solution onto the surface of the substrate or onto a liquid supporting element positionable proximate to the carrier and structured for carrying the solution (e.g., nozzles as a component of the substrate carrier, a jet-spray assembly, etc.). In preferred embodiments, the system includes or incorporates an element for applying pressure (downforce or upforce) onto the electrolyte solution to enhance contact of the solution with the surface of substrate (e.g., a processing pad with the electrolyte solution between the pad and the substrate, force from a jet-spray assembly, etc.). It is also preferred that the system includes or incorporates an element for causing movement of the electrolyte solution over the surface of the substrate, for example, the apparatus being operable to rotate or otherwise move the carrier bearing the substrate within the electrolyte solution, and/or move a processing pad and/or the carrier relative each other to cause movement of the electrolyte solution, among other elements.

In another embodiment, the system includes a planarizing or polishing apparatus (e.g., CMP tool) having a carrier or support for a wafer or other substrate, a support for a processing pad proximal to the surface of the substrate on the carrier, actuating assemblies to move the carrier and/or processing pad support (e.g., axially, vertically, rotationally, etc.), a source of electrolyte solution according to the invention, and a device for dispensing the electrolyte solution for contact with the surface of the substrate.

In yet another embodiment, the system includes a carrier or support for a substrate, a source of electrolyte solution according to the invention, and a device for dispensing the electrolyte solution directly onto the surface of the substrate supported by the carrier, for example, a showerhead, jet spray apparatus, and the like.

In a further embodiment, the system includes a carrier for a substrate, a source of electrolyte solution according to the invention contained within a vessel (e.g., bath), and an inlet and outlet for flowing the electrolyte solution into the vessel.

The invention advantageously eliminates the need for an electrode assembly to apply an external potential for selective removal of a conductive metal relative to dielectric material and/or selective removal of a conductive metal such as a barrier metal relative to dielectric material and to a different conductive metal such as a copper interconnect. The invention also eliminates the need for both contact and a high downforce by a processing pad onto the surface of a substrate (e.g., wafer, microelectronic substrate, etc.) that can damage structures and features of the substrate (e.g., scratch copper interconnects, etc.). The present methods can be utilized as an alternative to conductive metal CMP (e.g., WCMP), which also requires lower downforces.

According to the invention, a conductive metal less noble than the nanoparticles in the electrolyte solution can be removed selectively relative to dielectric material without either of those processing elements, utilizing a low stress, non-contact process (i.e., zero-touch with a processing pad or other like component). In addition, the invention eliminates the need for an abrasive component that can scratch or erode interconnect and dielectric material layers. With the present method, removal of a conductive metal can be performed without a CMP tool, thus eliminating the expense of a processing pad, and achieving a lower production cost using a simple tool design. In addition, the present method uses galvanic reactions to drive the oxidation step and therefore is not limited by hardware requirements and overcomes problems that occur by the disruption of electrical contact (i.e., open circuits) of current ECMP and electrolytic processes.

By engineering the size of the nanoparticles, the compositions can be applied to selectively remove a metal material that is less noble relative to the nanoparticles (e.g., bulk tungsten) from the surface of a substrate without getting into small contact holes containing the metal as a "plug" (e.g., a tungsten contact plug). This also limits what is known as "keyhole blowout" in which gaps or seams that are formed during CVD film deposition subsequently become exposed to wet chemistry that gets into the gap/seam. This is avoided with the present solutions, using nanoparticles sized larger than the seam/gap.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 3A and 3C illustrate diagrammatic, elevational, cross-sectional views of an embodiment of a system according to the invention, incorporating a processing pad.

FIGS. 5A and 5B are diagrammatic, elevational, cross-sectional views of another embodiment of a system according to the invention, incorporating a spray device for delivery of an electrolyte solution.

DETAILED DESCRIPTION OF THE INVENTION

The following description with reference to the drawings provides illustrative examples of devices, assemblies, systems, and methods for selectively removing conductive metal material from semiconductor wafers and other substrates according to the invention. Such description is for illustrative purposes only and not for purposes of limiting the same. The present invention can be utilized to provide other embodiments of devices, assemblies, and systems in accordance with the invention.

In the context of the current application, the terms "semiconductor substrate," "semiconductive substrate," or "semiconductive wafer fragment," "wafer fragment," or "wafer," will be understood to mean any construction comprising semiconductor material including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above. The terms "microelectronic substance" and "workpiece" are understood to include a variety of substrates in or on which microelectronic devices, micromechanical devices, data storage elements, and other features are fabricated. For example, microelectronic substances can be semiconductor wafers, glass substrates, dielectric or insulated substrates, and metal-containing substrates, among others. The terms "planarization" and "planarizing" refer to the removal of material from a surface by chemical-mechanical planarization or mechanical planarization or polishing. The terms "chemical-mechanical polishing" and "CMP" refer to a dual mechanism having both chemical and mechanical components to remove material, as in wafer polishing.

The term "external potential" refers to a voltage potential supplied by an external power supply through an electrode or electrolyte solution.

As used herein, the % by weight amounts (% wt) is based upon the total weight of the electrolyte solution.

Steps in an embodiment of a method for selectively removing one conductive metal relative to another conductive metal according to an embodiment of the invention are illustrated in FIGS. 3A-3D.

Figure 1:
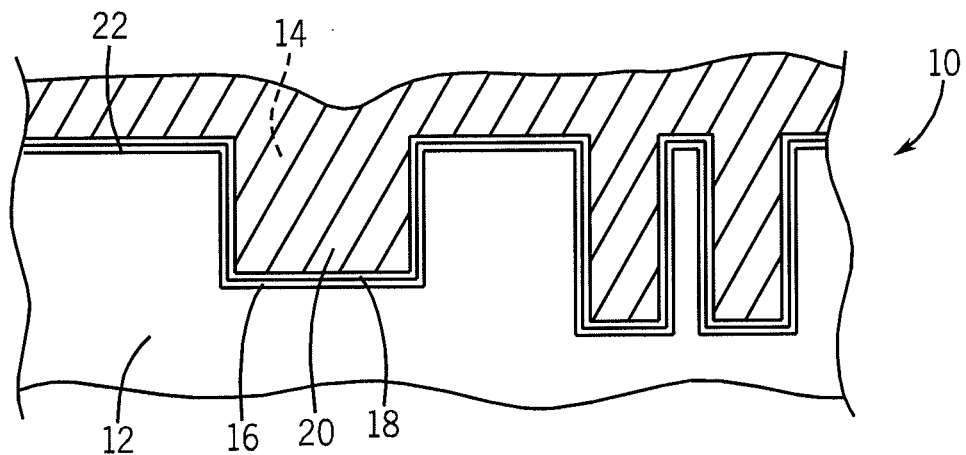
FIGS. 1 and 1A are diagrammatic, elevational, cross-sectional views of a portion of a substrate having multiple conductive metal layers fabricated by a prior art damascene process at sequential processing steps.
Figure 1A:
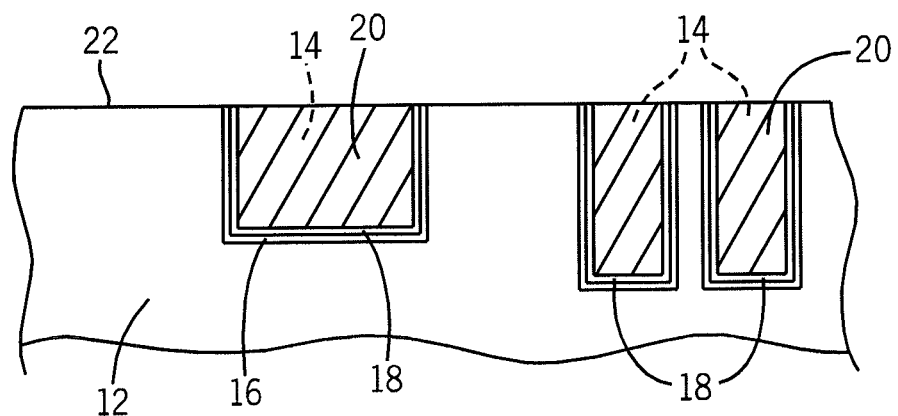
Figure 2:
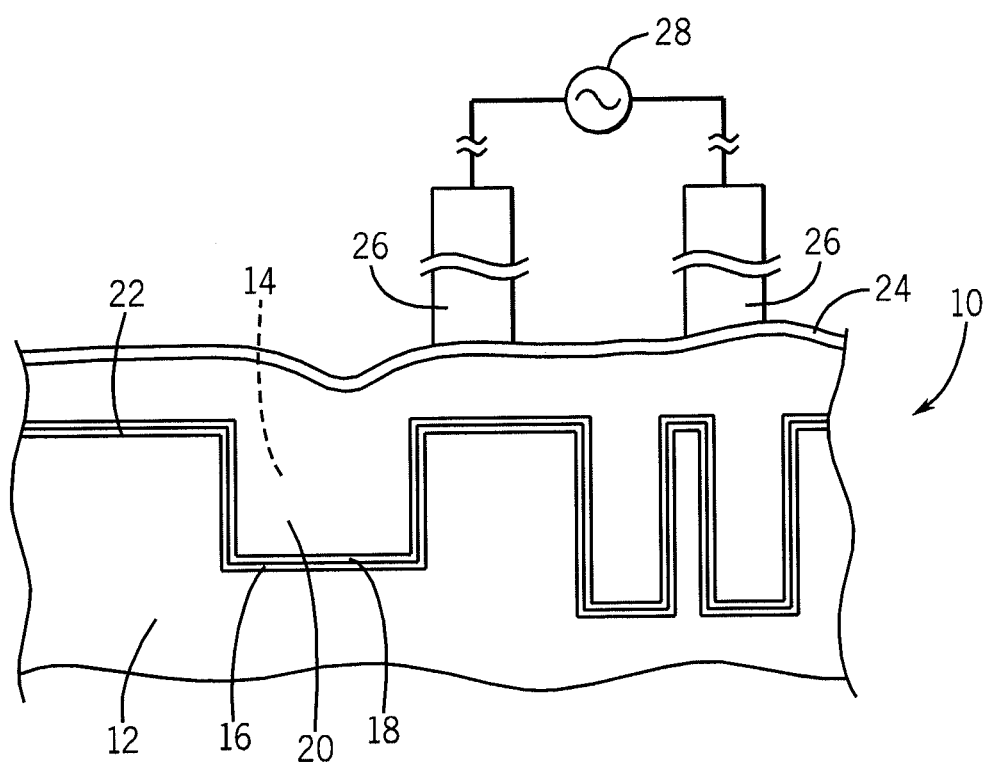
FIG. 2 is a diagrammatic, elevational view of a prior art ECMP apparatus with the substrate of FIG. 1 prior to processing.

The described embodiment is with reference to substrate 10 of FIG. 1, which is a wafer in the present example, having an insulating layer 12 such as an oxide or dielectric constant material, including a low K dielectric material, with openings 14 formed into the layer 12. A barrier metal layer 16 overlies the insulating layer 12 within the openings 14 and over the surface 22 of the insulating layer 12. Exemplary barrier metal layer materials that can be removed according to the process of the invention include tantalum (Ta), tantalum nitride (TaN), tantalum silicon nitride (TaSiN), titanium (Ti), titanium nitride (TiN), titanium silicon nitride (TiSiN), tungsten (W), tungsten nitride (WNx), tungsten silicon nitride (WSiN), ruthenium (Ru), and ruthenium oxide (RuO2, Ru2O3), bilayers of those materials such as overlying layers of Ta/TaN or Ti/TiN, and graded layers in which the nitrogen content in the metallic nitride is graded from a first concentration adjacent the interlevel dielectric to about zero adjacent the metallic element (e.g., TaN to Ta), being tantalum in the present example.

A conductive metal layer 20 has been deposited over the barrier layer 16 to fill the openings 14, with excess material deposited over the surface of the substrate. The conductive metal layer 20 can be deposited using a variety of processes, such as chemical vapor deposition (CVD), physical vapor deposition (PVD), plasma enhanced chemical vapor deposition (PECVD), electroplating or electroless processes, etc. Exemplary conductive metal materials include copper (Cu), platinum (Pt), molybdenum (Mo), cobalt (Co), magnesium (Mg), nickel (Ni), silver (Ag), palladium (Pd), and aluminum (Al), and alloys thereof. In the present example, the conductive metal layer 20 is copper (e.g., copper, copper alloy containing at least about 80 wt % copper, etc.), with a copper seed layer 18 (FIG. 1) having been formed over the barrier layer 16 prior to the formation of the copper layer 20.

Figure 3A:
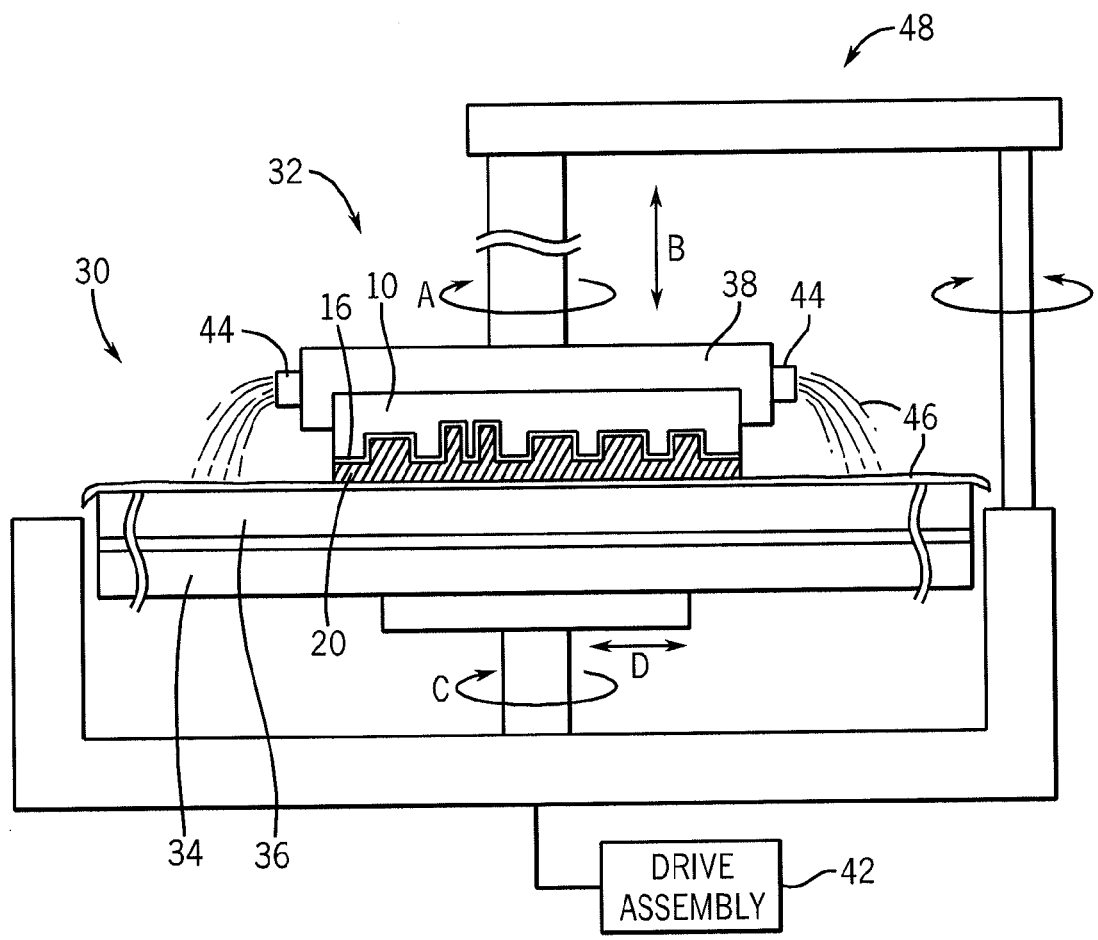
FIGS. 3A-3D are views of the FIG. 1 substrate at sequential processing steps according to an embodiment of the method and system of the invention.

As depicted in FIG. 3A, an embodiment of a system 30 is composed of a planarizing apparatus 32 that includes a circular table or platen 34 for a processing pad 36, and a carrier 38 supporting wafer 10, which can be a standard set-up for planarizing or polishing a workpiece. As illustrated, the platen 34 is connected to a drive-assembly 42 that provides rotational (arrow "C") and/or axial (arrow "D") motion to the platen 34. In the illustrated example, the carrier 38 includes nozzles 44 for delivery of processing liquids 46, e.g., a planarizing slurry, onto the surface of the processing pad 36, although other delivery mechanisms can be used. The carrier 38 is coupled to an actuator assembly 48 to provide rotational (arrow "A") and/or vertical (arrow "B") motion to the carrier 38. In operation, the wafer 10 and/or the processing pad 36 are moved relative to one another allowing abrasive particles in the pad or slurry and reactive chemicals to mechanically and chemically remove the conductive metal layer 20 from the wafer 10.

Figure 3B:
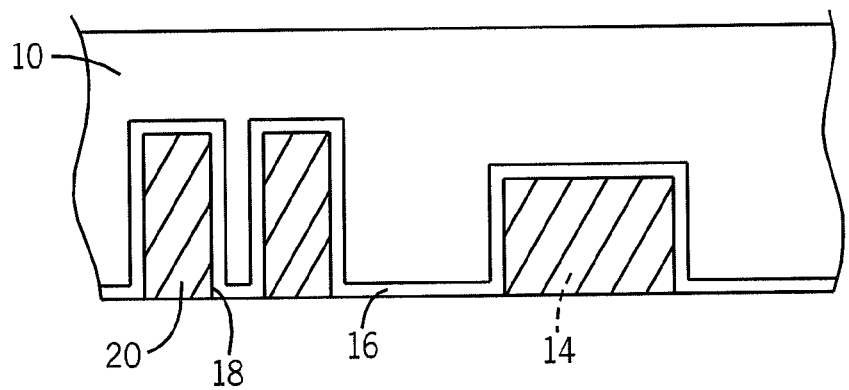

Utilizing the apparatus of FIG. 3A, in a first step, excess or the bulk conductive metal layer 20 can be polished down to the barrier layer 16 using a conventional method and processing solution 46 (e.g., slurry) dispensed from the nozzles 44, and contact by the processing pad 36 with the surface of the wafer 10, leaving the openings filled with inlaid metal 20 (e.g., interconnect) as shown in FIG. 3B. In the case of copper removal, a standard slurry having a low abrasive content is typically used.

Figure 3C:
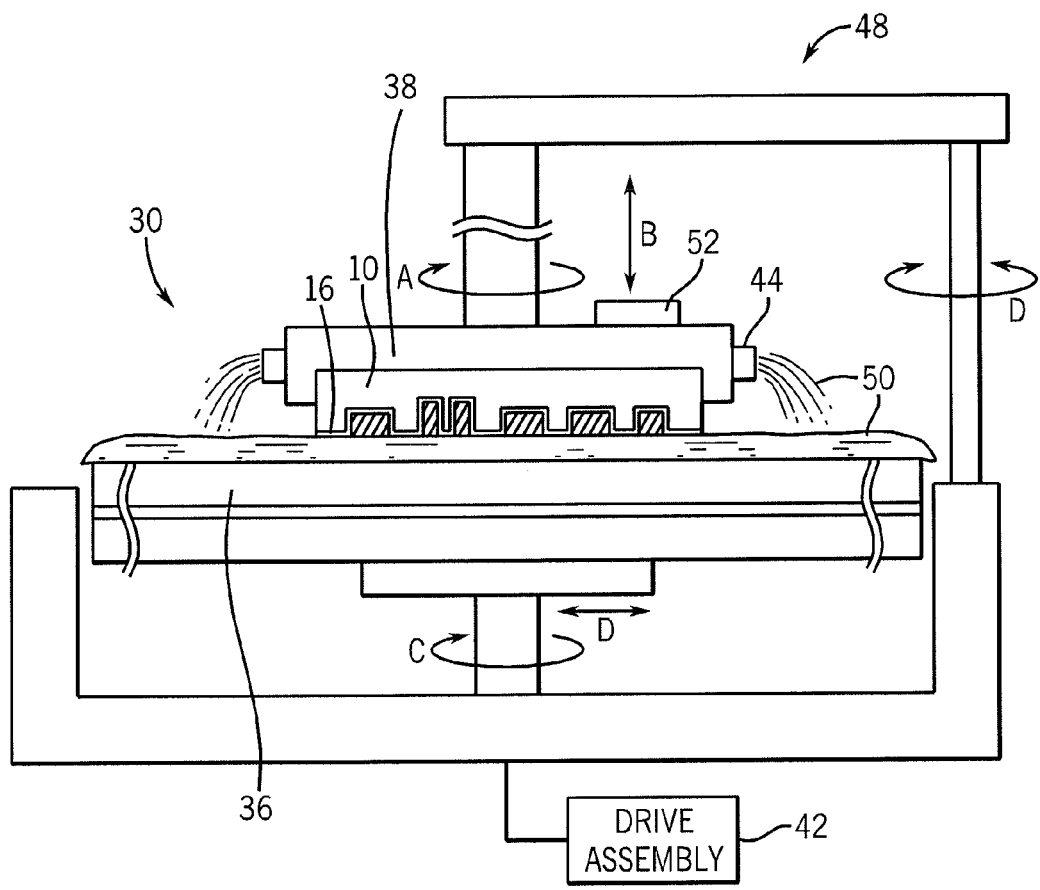
Figure 3D:
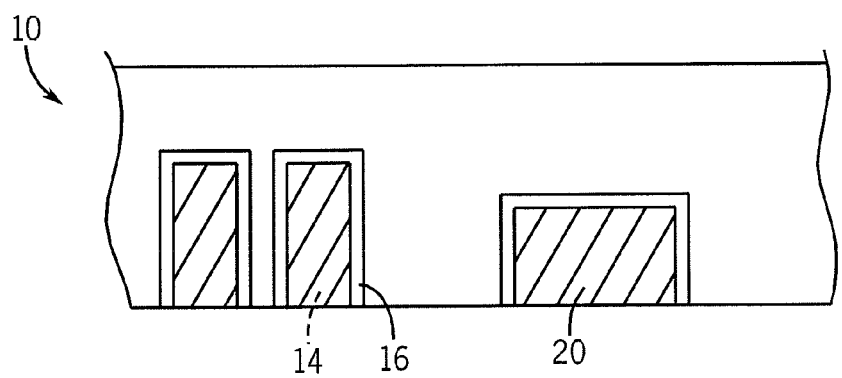

Referring now to FIG. 3C, the invention provides for the selective removal of the excess barrier metal layer 16 (e.g., tantalum, etc.) external to the openings 14 using an electrolyte process without applying an external potential or surface-to-surface contact between the processing pad 36 and the wafer 10, resulting in the structure shown in FIG. 3C. The process can be conducted at ambient temperature up to a maximum temperature that is compatible with an electrolyte solution.

The invention utilizes an electrolyte solution 50 comprising nanoparticles dispersed in a chemically compatible solvent. Etching of the barrier metal layer 16 is achieved by application of the electrolyte solution without an external potential to drive the reaction.

Not wishing to limit the invention to a particular theory, it is believed that the mechanism of removal of the barrier metal layer 16 by the present method is through the creation of a galvanic cell between the nanoparticles, electrolyte, and barrier metal (e.g., tantalum, Ta), which includes the water oxidation of the barrier metal to an oxide (e.g., Ta to tantalum oxide, TaxOy (e.g., Ta2O5)) as a result of the direct contact of the nanoparticles with the barrier metal layer 16, and the subsequent stripping (e.g., etching) of the Ta oxide layer by a HF component to expose fresh barrier metal (e.g., Ta), wherein the cycle is repeated to remove the barrier metal layer 16.

The nanoparticle component of the electrolyte solution 50 is a substance that is more noble, i.e., less active and more chemically inert, and has a stronger reducing potential than the material that is to be removed. Suitable nanoparticles are those substances that have a particle size diameter of about 0.001 µm to 5 µm, and preferably about 0.5 µm to 1 µm, are dispersible and form a suspension in the electrolyte solvent to form a slurry-like consistency, and will minimally agglomerate on the target surface to provide wide-spread surface area coverage over the material layer to be removed, e.g., the barrier layer 16. Exemplary nanoparticles include, but are not limited to, colloidal carbon (e.g., colloidal graphite), glassy carbon, silver, platinum, gold, and nickel-chromium, alloys of those metals, conductive oxides, and engineered colloids or catalysts.

The nanoparticles are suspended in a suitable and compatible electrolyte to form a slurry-like consistency. Suitable solvents include solvents having a dielectric constant less than 40. The concentration of the particles in the electrolyte solution 50 can generally range from about 0.01-10 wt %, and preferably about 0.01-1 wt %.

In one embodiment, the electrolyte solution is composed of a mixture of hydrofluoric acid (HF) with an alcohol in an about 5:1 to about 50:1 ratio, preferably an about 10:1 ratio (HF:alcohol). Exemplary alcohols include methanol, ethanol, ethylene glycol, propanol (e.g., 2-propanol or isopropanol (IPA)), butanol (e.g., 1-butanol, 2-butanol, and tert-butanol (i.e., 2-methylpropan-2-ol)), and mixtures thereof. In the application of an HF/alcohol-based electrolyte solution, the HF etches away and dissolves the barrier metal oxide layer (e.g., TaxOy), thus exposing fresh barrier metal (e.g., Ta).

In another embodiment, the electrolyte solution is composed of a mixture of HF with a glacial carboxylic acid in an about 10:1 to about 100:1 ratio, preferably an about 50:1 ratio (acid:HF). Exemplary glacial carboxylic acids include acetic acid, butanoic acid, and proprionic acid.

In another embodiment, the electrolyte solution is composed of a mixture of an alcohol with one or more soluble salts that will dissolve in the alcohol solvent to provide cations and anions (e.g., NH4+, Cl—, ionic liquids) for a conduction path for electrochemical reactions and dissolution of the barrier layer (e.g., Ta). Exemplary ion sources for the electrolyte solution include salts of chloride, fluoride, succinate, and citrate, including ammonium and potassium salts (e.g., ammonium chloride (NH4Cl), potassium chloride (KCl), ammonium fluoride (NH4F), etc.), and mixtures thereof. Exemplary alcohols include, for example, methanol, ethanol, ethylene glycol, propanol (e.g., 2-propanol or iso-propanol (IPA)), butanol (e.g., 1-butanol, 2-butanol, or tert-butanol (i.e., 2-methylpropan-2-ol)), and mixtures thereof. A salt/alcohol-based electrolyte preferably comprises the salt at saturation, which is typically at least about 1 wt % (about 1% per 100 ml solvent), and preferably about 1-10 wt % (about 1% to 10% per 100 ml solvent)

The electrolyte solution 50 is formulated to provide a barrier metal (e.g., Ta) to conductive metal interconnect (e.g., Cu) selectivity of at least about 1:1, and preferably about 10:1 to about 100:1. The removal rate of the barrier metal layer 16 can be modified by adjusting the HF and colloidal particle concentrations.

As depicted in FIG. 3C, the electrolyte solution 50 containing the nanoparticles can be dispensed, for example, through the nozzles 44 of the wafer carrier 38 (or other dispensing device) to form a layer of the solution 50 between the wafer 10 and the surface of the processing pad 36. The wafer carrier 38 can be moved downwardly (arrow "B") to place the barrier layer 16 on the wafer 10 in contact with the electrolyte solution 50.

Contact between the processing pad 36 and the surface of the wafer 10 is not required for removal of the barrier metal layer 16. However, moderate pressure of the electrolyte solution 50 against the surface of the wafer 10 ensures good contact and enhances the attachment of the nanoparticles onto the surface of the barrier metal layer 16. For example, a downward pressure or downforce of the wafer carrier 38 onto the processing pad 36 (arrow B) of up to about 5 psi, or about 0.5-5 psi (without contact) can be applied to increase the contact force of the electrolyte solution 50 against the surface of the barrier layer 16. The electrolyte solution 50 is chemically compatible with the processing pad 36, i.e., will not dissolve or otherwise break down.

Although not preferred, up to minimal or a nominal contact between the processing pad 36 and the wafer 10 may be desirable to facilitate removal of the metal oxide as it is formed. In that instance, a relatively soft processing pad 36, such as a plastic-like polyurethane, felt, spongy or compressible material, or other suitable material, can be used to apply a low downforce to promote colloidal contact but avoid mechanical stress that can damage sensitive dielectrics.

It is also preferred that a continuous movement or flow of the electrolyte solution 50 over the surface of the barrier metal layer 16 is provided to refresh the electrolyte solution 50, and to replenish and circulate the solution 50 through the system. This provides for mass transport of the oxidizing agent (water) over the surface of the barrier layer 16.

Various techniques can be utilized to generate a continuous flow of the electrolyte solution 50 over the barrier layer 16. For example, an oscillating force can be applied to agitate the solution 50, for example, by rotating the carrier 38 holding the wafer 10 (arrow "A") and/or the processing pad 36 (arrow "C") relative to each other, or by vertically moving the wafer carrier 38 supporting the wafer 10 (arrow "B") within the electrolyte solution 50. In addition, the wafer 10 can be moved in a horizontal direction through the electrolyte solution 50 using an actuator 48 that rotates (arrow "D") and "sweeps" the carrier 38 and wafer 10 across and above the surface of the processing pad 36. Such movement of the wafer 10 helps maintain a flow of fresh electrolyte solution 50 over the barrier metal layer 16 to enhance the oxidation of the metal oxide layer.

In addition, the system can incorporate a high-intensity wave-generator such as an ultrasonic transducer 52 that transmits ultrasonic frequencies (i.e., above 20 kHz), megasonic frequencies (e.g., about 500 kHz to 5 MHz), or other frequency, to vibrate the processing pad 36, the wafer 10, and/or the electrolyte solution 50, in a wet clean environment, for increasing contact of the nanoparticles with the target material. The transducer 52 may be a piezoelectric material, such as metallized quartz, that can be positioned, for example, in the head of the carrier 38 (as shown), proximate to the processing pad 36, or in an actuator assembly. The application of high frequency processing is advantageous to provide transverse application of energy to stimulate acoustic streaming delivery (flow) of the solvent across the substrate 10 (e.g., wafer), and to improve efficiency by increasing nanoparticle/surface contact.

Figure 4:
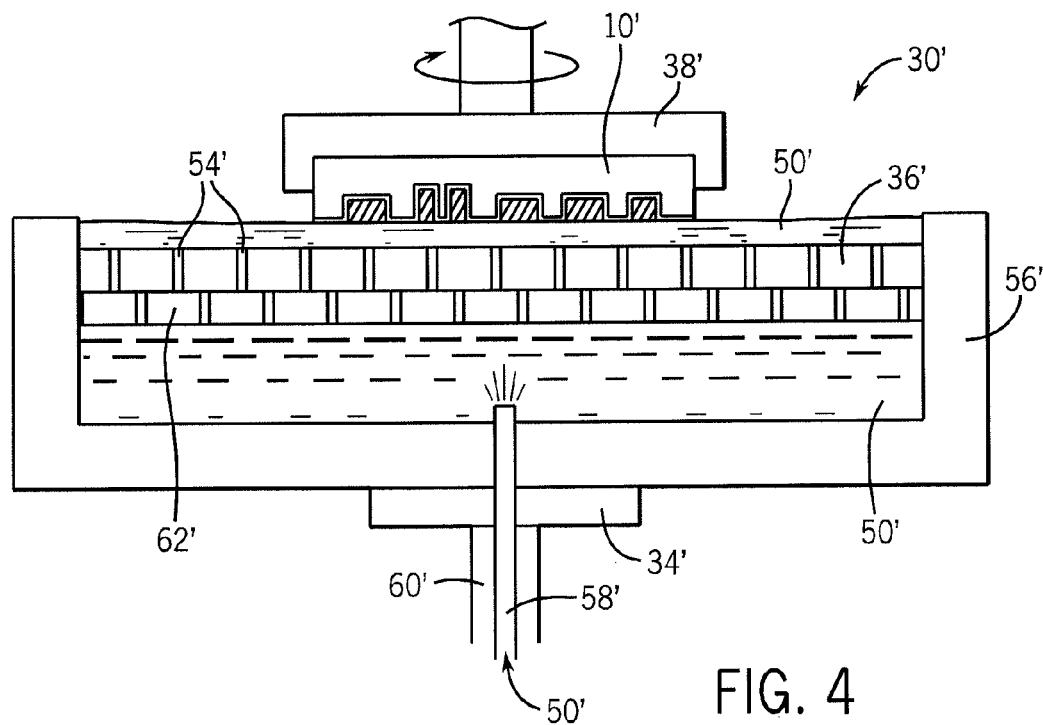
FIG. 4 is a diagrammatic, elevational, cross-sectional view of another embodiment of a system according to the invention, incorporating a flow-through processing pad.

As depicted in FIG. 4, continuous flow can also be provided by using a system 30' that includes a processing pad 36' having perforations or channels 54' that allow fluid flow through the pad 36'. Such pads are commercially available, for example, from Rodel, Inc. The system 30' can be structured with a partial enclosure 56' that defines a container into which the electrolyte solution 50' can be dispensed, for example, through a port 58' in the shaft 60' of the platen 34' and confined within the enclosure 56'. The flow-through processing pad 36' can be supported by a diffuser plate 62', and the electrolyte solution 50' can be pumped through the channels 54' extending through the pad 36' to the interface between the wafer 10' and the pad 36'.

In another embodiment, the system 30" can be structured as a single or batch wet processing tool with a spray device 64" to deliver the electrolyte solution 50" upward (FIG. 5A) or downward (FIG. 5B) onto the surface of the wafer 10", for example, a showerhead or a high flow sprayer (e.g., a jet sprayer). The system 30" can further include a device 66" operable to control the temperature of the electrolyte solution 50".

Figure 6:
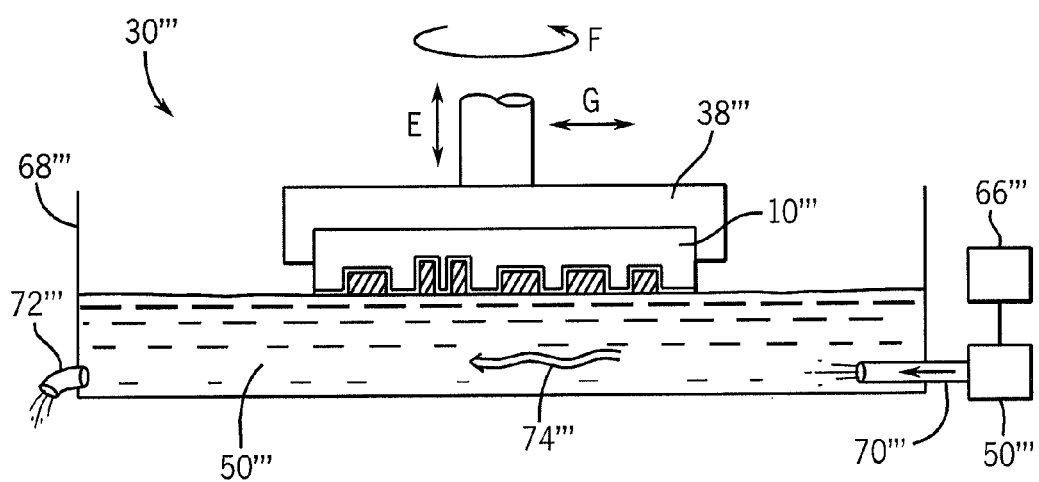
FIG. 6 is a diagrammatic, elevational, cross-sectional view of another embodiment of a system according to the invention, incorporating a container for the electrolyte solution.

In another embodiment of a wet strip system, illustrated in FIG. 6, the system 30''' can be structured with a partial enclosure 68''' that defines a container or vessel for containing the electrolyte solution 50'''. The vessel 68''' is sized for receiving a carrier 38''' supporting the wafer 10''', which can be moved downwardly (arrow E) to bring the surface of the wafer 10''' into contact with the electrolyte solution 50'''. Movement can be provided to enhance the chemical reaction and removal of the barrier layer 16 (not depicted), for example, by rotating the carrier 38''' (arrow F), and/or by moving the carrier 38''' vertically (arrow E) or horizontally (arrow G) through the solution 50'''. The electrolyte solution 50''' can be flowed into the vessel 68''' via an inlet conduit 70''' (or other dispensing element), through the system 30''', and out of an outlet conduit 72'''. The system 30''' can include a mechanism 74''' for flowing the electrolyte solution 50''' through the container or vessel 68'''. The system 30''' can further include a temperature control device 66''' operable to control the temperature of the electrolyte solution 50'''.

The present compositions and methods can be used to selectively remove a less noble metal on a substrate surface relative to another metal material layer as described hereinabove.

Figure 7:
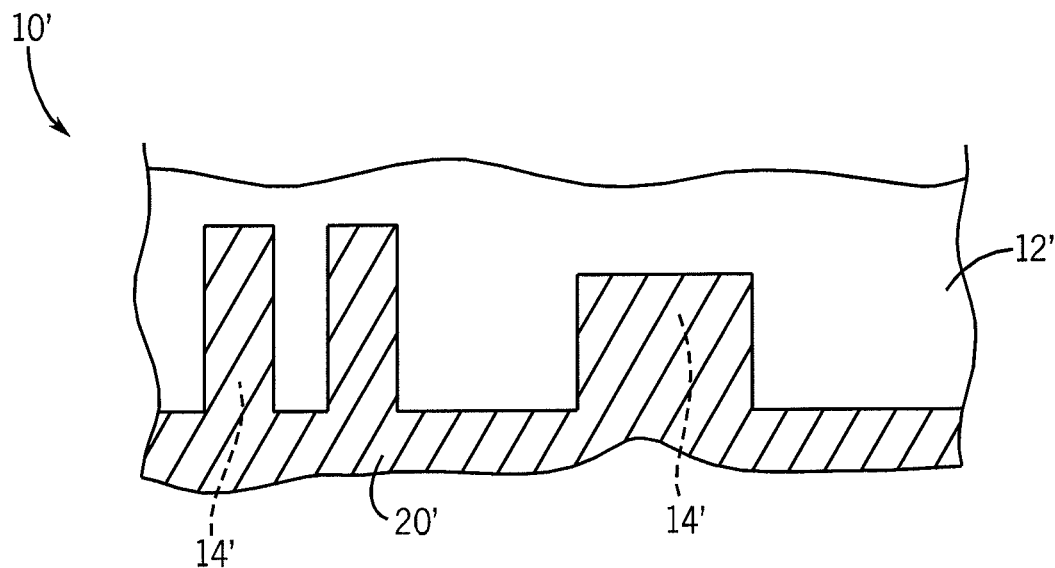
FIGS. 7 and 8 are diagrammatic, elevational, cross-sectional views of a portion of a substrate at sequential processing steps according to another embodiment of the method according to the invention.
Figure 8:
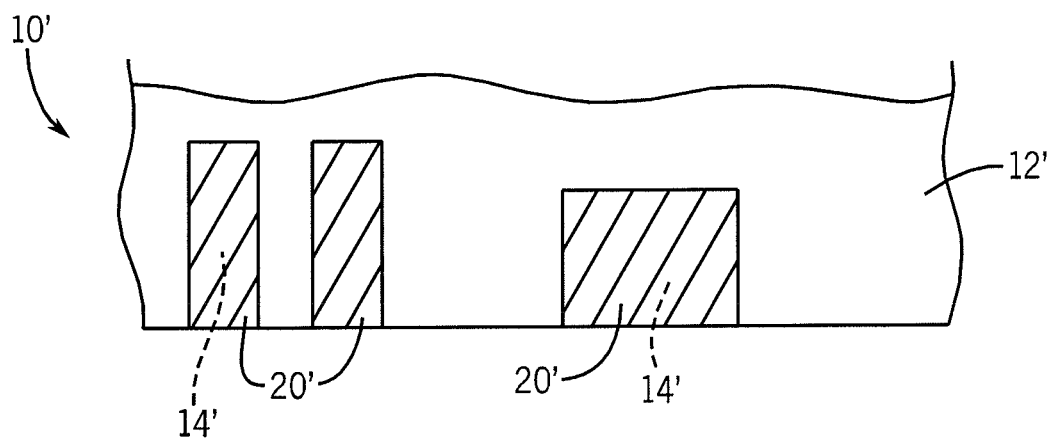

FIGS. 7 and 8 illustrate steps in another embodiment of a method for selectively removing a conductive metal material (e.g., tungsten (W), chromium (Cr), and aluminum (Al), or metal alloy) that is less noble than the nanoparticles (e.g., silver (Ag)) selectively relative to a dielectric material (e.g., low-k dielectric), including an inter layer dielectric (ILD) layer, or a non-conducting fill material. Exemplary dielectric materials include, for example, doped silicon dioxide (i.e., a glass, such as borosilicate glass (BSG), phosphosilicate glass (PSG), or borophosphosilicate glass (BPSG)), undoped silicon dioxide, silicon nitride, silicon oxynitride, tantalum pentoxide, a dielectric polymer (e.g., polyimide, spin-on-polymers (SOPs), parylene, flare, polyarylethers, polytetrafluoroethylene, benzocyclobutene (BCB), SILK, fluorinated silicon oxide (FSG), hydrogen silsesquioxane, among others).

Referring to FIG. 7, a substrate 10' having an insulating layer 12' (e.g., low-k dielectric) has been pattern etched to provide openings 14' therein. A conductive metal layer 20' (e.g., aluminum) has been deposited onto the insulating layer 12' to fill the openings 14'. The compositions of the invention as described above, can be utilized remove the conductive metal layer 20' selectively relative to the insulating layer 12', resulting, for example, in the structure shown in FIG. 8.

In this application, the electrolyte solution is formulated to provide a selectivity of the conductive metal to a low-k dielectric layer of at least 2:1, and preferably about 5:1 to about 20:1.

In compliance with the statute, the invention has been described in language more or less specific as to structural and methodical features. It is to be understood, however, that the invention is not limited to the specific features shown and described, since the means herein disclosed comprise pre-

What is claimed is:

1. An electrolyte composition, comprising:
   a solvent having a dielectric constant of less than 40; and
   nanoparticles selected from the group consisting of colloidal carbon, glassy carbon, silver, platinum, nickel-chromium, conductive oxides, and engineered colloids or catalysts.

2. The electrolyte composition of claim 1, wherein the solvent comprises an ionic liquid.

3. The electrolyte composition of claim 1, wherein the solvent comprises a hydrofluoric acid/glacial carboxylic acid solution.

4. The electrolyte composition of claim 1, wherein the solvent comprises a solution of an alcohol and a salt dissolved in the alcohol.

5. The electrolyte composition of claim 4, wherein the salt dissolved in the alcohol is selected from the group consisting of a salt of chloride, fluoride, succinate and citrate.

6. The electrolyte composition of claim 4, wherein the salt dissolved in the alcohol is selected from the group consisting of ammonium salts and potassium salts.

7. The electrolyte composition of claim 4, wherein an amount of the salt dissolved in the alcohol is at saturation.

8. The electrolyte composition of claim 1, wherein the nanoparticles comprise about 0.01% by weight to 10% by weight based on a total weight of the electrolyte composition.

9. An electrolyte composition, comprising:
   a hydrofluoric acid/alcohol solution having a dielectric constant of less than 40; and
   nano articles selected from the group consisting of colloidal carbon, glassy carbon, silver, platinum, gold, nickel-chromium, conductive oxides, and engineered colloids or catalysts.

10. The electrolyte composition of claim 9, wherein the nanoparticles comprise about 0.01% by weight to 10% by weight based on a total weight of the electrolyte composition.

11. The electrolyte composition of claim 9, wherein the hydrofluoric acid/alcohol solution comprises a ratio of hydrofluoric acid:alcohol of from about 5:1 to about 50:1.

12. An electrolyte composition, comprising:
   a glacial carboxylic acid/hydrofluoric acid solution having a dielectric constant of less than 40; and
   nanoparticles selected from the group consisting of colloidal carbon, glassy carbon, silver, platinum, gold, nickel-chromium, conductive oxides, and engineered colloids or catalysts.

13. The electrolyte composition of claim 12, wherein the nanoparticles have a particle size of about 0.001 μm to 5 μm.

14. The electrolyte composition of claim 12, wherein the nanoparticles comprise about 0.01% by weight to 10% by weight based on a total weight of the electrolyte composition.

15. The electrolyte composition of claim 12, wherein the glacial carboxylic acid is selected from the group consisting of acetic acid, butanoic acid and propionic acid.

16. An electrolyte composition, comprising:
   nanoparticles selected from the group consisting of colloidal carbon, silver, and platinum; and
   a solvent having a dielectric constant of less than 40 and selected from the group consisting of a hydrofluoric acid/alcohol solution, a hydrofluoric acid/glacial carboxylic acid solution, a dissolved salt/alcohol solution, and an ionic liquid.

17. A system for removing a conductive metal selectively relative to a dielectric material on a substrate, the system comprising:
   a carrier for supporting the substrate;
   a device for dispensing an electrolyte composition; and
   a source of the electrolyte composition, the electrolyte composition comprising nanoparticles selected from the group consisting of colloidal carbon, glassy carbon, silver, gold, platinum, nickel-chromium, conductive oxides, and engineered colloids or catalysts in a solvent having a dielectric constant of less than 40 and selected from the group consisting of a hydrofluoric acid/alcohol solution and a hydrofluoric acid/glacial carboxylic acid solution, the electrolyte composition configured to remove the conductive metal selectively relative to the dielectric material on the substrate without an applied potential.

18. A planarizing apparatus, comprising:
   a support for a processing pad proximal to a substrate on a carrier;
   actuating assemblies for moving the carrier, the support for the processing pad or both;
   a source for dispensing an electrolyte composition for contact with the substrate; and
   a source of the electrolyte composition, the electrolyte composition comprising nanoparticles in a solvent having a dielectric constant of less than 40, the nanoparticles selected from the group consisting of colloidal carbon, glassy carbon, silver, platinum, nickel-chromium, conductive oxides, and engineered colloids or catalysts.

19. The planarizing apparatus of claim 18, wherein the solvent having a dielectric constant of less than 40 comprises an ionic liquid.

20. The planarizing apparatus of claim 18, wherein the solvent having a dielectric constant of less than 40 comprises a dissolved salt/alcohol solvent.

* * * * *

UNITED STATES PATENT AND TRADEMARK OFFICE
CERTIFICATE OF CORRECTION

PATENT NO. : 8,603,318 B2
APPLICATION NO. : 13/098572
DATED : December 10, 2013
INVENTOR(S) : Rita J. Klein et al.

Page 1 of 1

It is certified that error appears in the above-identified patent and that said Letters Patent is hereby corrected as shown below:

In the Claims

In column 11, line 34, in Claim 9, delete "nano articles" and insert -- nanoparticles --, therefor.

Signed and Sealed this
Twenty-fifth Day of March, 2014

Michelle K. Lee
*Deputy Director of the United States Patent and Trademark Office*